United States Patent
Schubert

(10) Patent No.: US 6,784,462 B2
(45) Date of Patent: Aug. 31, 2004

(54) LIGHT-EMITTING DIODE WITH PLANAR OMNI-DIRECTIONAL REFLECTOR

(75) Inventor: E. Fred Schubert, Canton, MA (US)

(73) Assignee: Rensselaer Polytechnic Institute, Troy, NY (US)

(*) Notice: Subject to any disclaimer, the term of this patent is extended or adjusted under 35 U.S.C. 154(b) by 0 days.

(21) Appl. No.: 10/317,564

(22) Filed: Dec. 12, 2002

(65) Prior Publication Data

US 2003/0111667 A1 Jun. 19, 2003

Related U.S. Application Data

(60) Provisional application No. 60/339,355, filed on Dec. 13, 2001.

(51) Int. Cl.[7] .............................................. H01L 33/00
(52) U.S. Cl. .............................. 257/98; 257/91; 257/94; 257/97; 257/99; 257/103
(58) Field of Search .............................. 257/98, 94, 97, 257/99, 91, 103, 95, 96, 22, 79, 85, 90, 12, 13

(56) References Cited

U.S. PATENT DOCUMENTS

| | | |
|---|---|---|
| 4,212,021 A | 7/1980 | Ono et al. |
| 4,966,862 A | 10/1990 | Edmond |
| 5,008,718 A | 4/1991 | Fletcher et al. |
| 5,048,035 A | 9/1991 | Sugawara et al. |
| 5,060,028 A | 10/1991 | Kuo et al. |
| 5,153,889 A | 10/1992 | Sugawara et al. |
| 5,414,281 A | 5/1995 | Watabe et al. |
| 5,466,950 A | 11/1995 | Sugawara et al. |
| 5,744,829 A | 4/1998 | Murasato et al. |
| 5,905,275 A | 5/1999 | Nunoue et al. |
| 5,917,202 A | 6/1999 | Haitz et al. |
| 5,925,896 A | 7/1999 | Dutta |
| 5,939,735 A | 8/1999 | Tsutsui et al. |
| 6,222,207 B1 * | 4/2001 | Carter-Coman et al. ...... 257/98 |
| 6,492,661 B1 | 12/2002 | Chien et al. |
| 6,552,367 B1 * | 4/2003 | Hsieh et al. ................... 257/94 |
| 6,552,369 B2 * | 4/2003 | Chiou et al. ................... 257/98 |

FOREIGN PATENT DOCUMENTS

| | | |
|---|---|---|
| DE | 19945005 A1 | 3/2001 |
| DE | 20202493 U1 | 7/2002 |
| EP | 0 559 455 A1 | 9/1993 |
| JP | 03174780 | 7/1991 |
| WO | WO 01/82384 A1 | 11/2001 |

OTHER PUBLICATIONS

K. Streubel, N. Linder, R. Wirth, and A. Jaeger, High Brightness AlGaInP Light–Emitting Diodes, Mar./Apr. 2002, vol. 8, No. 2, pp. 321–332.

J. W. Graff, Th. Gessmann, E. F. Schubert, AlGaInP reflective–submount light–emitting diode, SPIE Photonics West 250 word abstract.

R. H. Horng et al., AlGaInP/AuBe/glass Light–Emitting Diodes Fabricated by Wafer Bonding Technology, Applied Physics Letters, vol. 75, No. 2, Jul. 12, 1999, pp. 154–156.

R. H. Horng et al., AlGaInP Light–Emiting Diodes with Mirror Substrates Fabricated by Wafer Bonding, Applied Physics Letters, vol. 75, No. 20, Nov. 15, 1999, pp. 3054–3056.

International Search Report.

* cited by examiner

Primary Examiner—Minhloan Tran
Assistant Examiner—Tan Tran
(74) Attorney, Agent, or Firm—RatnerPrestia

(57) ABSTRACT

A high extraction efficiency, light-emitting diode having a reflective submount and methods for forming the LED. A light-emitting region is disposed between a top contact and a conductive holder. The region extends beyond an area underlying the top contact. An omni-directional reflector is disposed between the light-emitting region and the conductive holder. According to one embodiment, the reflector comprises one or more electrically conductive contacts configured to correspond to an area beyond the area underlying the top contact. According to one embodiment, the reflector comprises a dielectric layer having a refractive index of between about 1.10 and 2.25, contacts extending through the reflector, and a reflective conductive film.

21 Claims, 7 Drawing Sheets

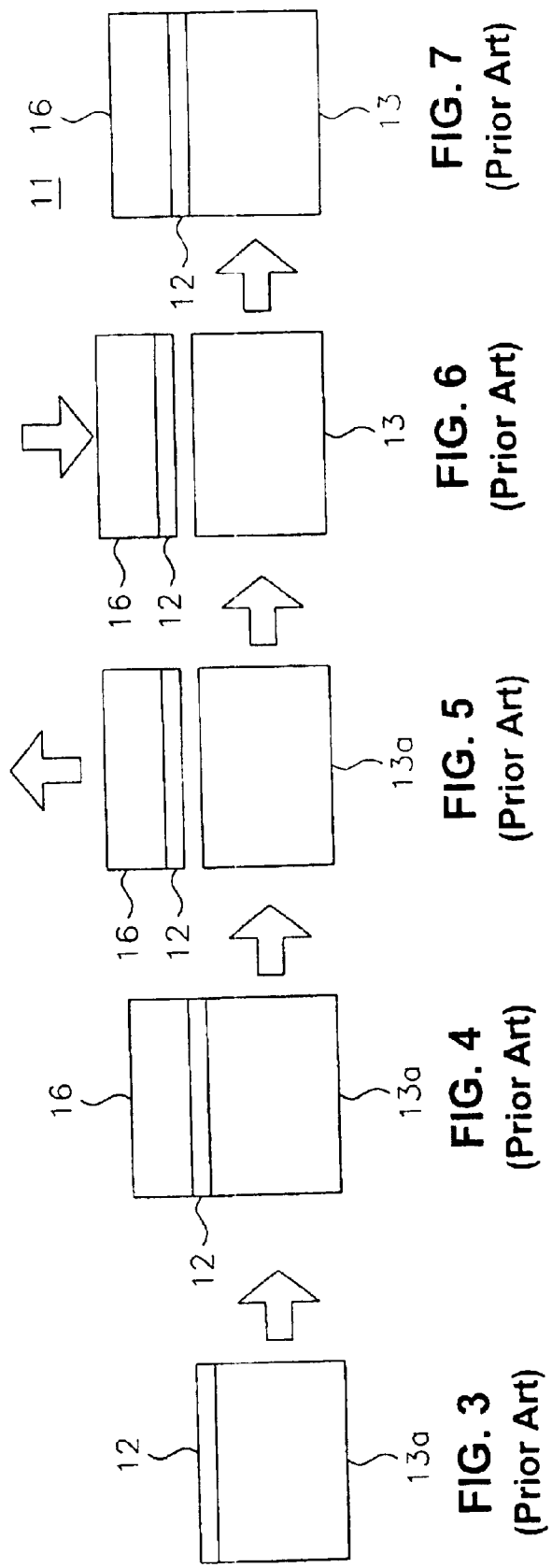

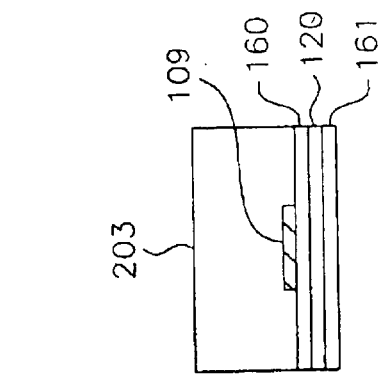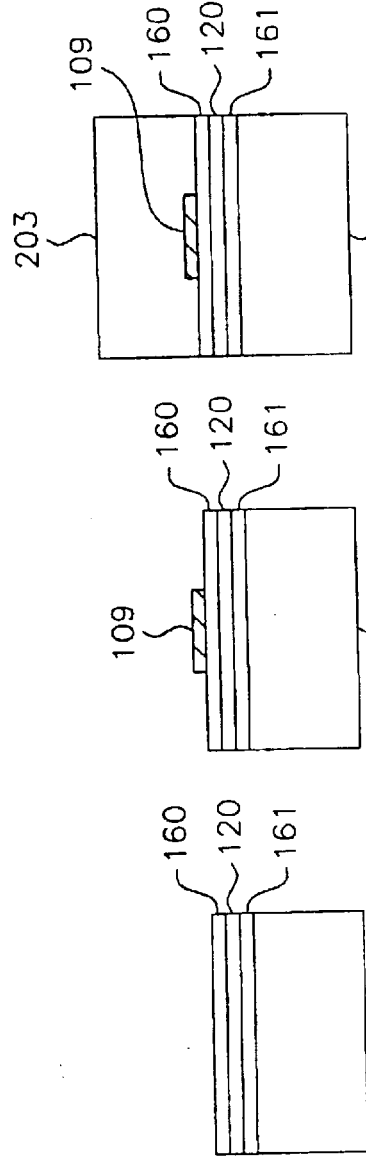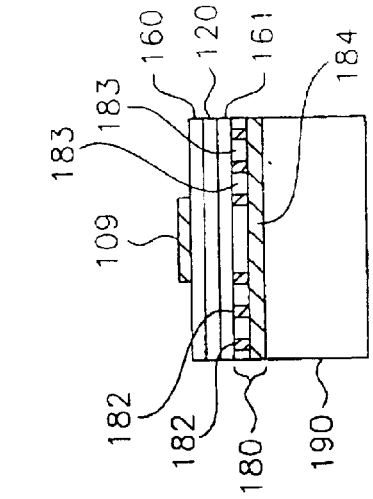

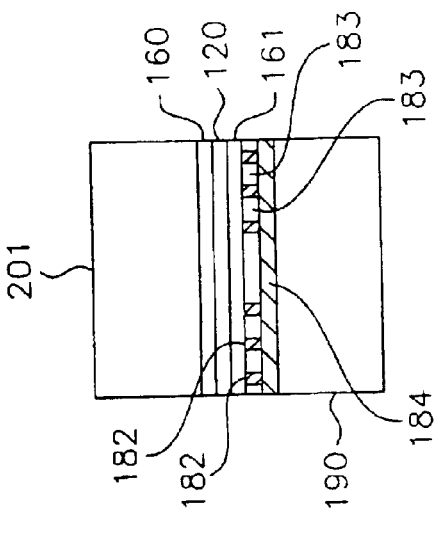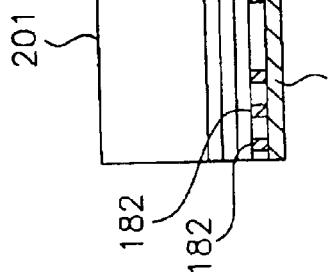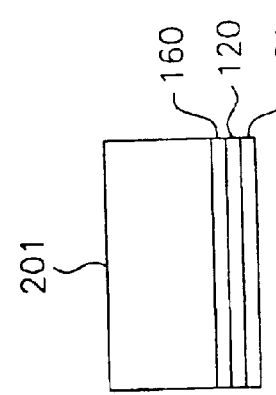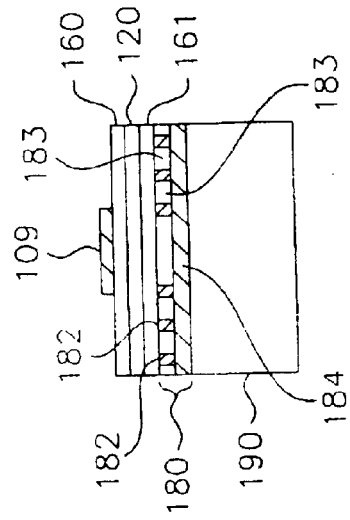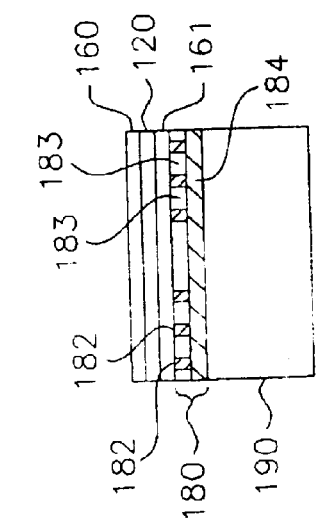

LIGHT-EMITTING DIODE WITH PLANAR OMNI-DIRECTIONAL REFLECTOR

This Application claims the benefit of Provisional Application No. 60/339,355 filed Dec. 13, 2001.

TECHNICAL FIELD

The present invention relates generally to a light-emitting diode (LED) and, more particularly, to an LED with an omni-directional reflector for enhanced light extraction efficiency.

BACKGROUND OF THE INVENTION

LEDs emit light in one or more of the infrared, visible, and ultraviolet spectral regions when an electrical current is passed through a semiconducting, light-emitting region. As shown in FIG. 1, a common LED 1 emits light in the 550 nm–700 nm wavelength range. LED 1 comprises an aluminum gallium indium phosphide (AlGaInP) active region 2 lattice-matched to a gallium arsenide (GaAs) substrate 3. Active region 2 comprises a light-emitting region 4 surrounded by two oppositely doped confinement layers 5. LED 1 may be referred to as an absorbing-substrate light-emitting diode (AS-LED) due to the light-absorbing characteristic of the GaAs substrate 3. The chemical formula for the composition of the active region material is $(Al_xGa_{1-x})_{0.5}In_{0.5}P$, where x can vary between 0.0 and 1.0. This chemical composition ensures that the $(Al_xGa_{1-x})_{0.5}In_{0.5}P$, commonly abbreviated as AlGaInP, is lattice-matched to the GaAs substrate 3.

Typically, AS-LED 1 comprises a window 6 overlying active region 2. Window 6 may be composed of gallium phosphide (GaP) that may also contain small amounts of other elements such as Al and In. Window 6 may also be composed of aluminum gallium arsenide, or $Al_xGa_{1-x}As$, commonly abbreviated as AlGaAs. An optically opaque top contact 9, typically comprising a highly electrically conductive metal or alloy is formed over window 6, and a highly electrically conductive substrate contact 10 is formed adjacent substrate 3 opposite active region 2. Window 6 may also be referred to as a current-spreading layer, because window 6 distributes electrical current over a larger area than that covered by top contact 9, as shown in FIG. 2. The active region 2, that comprises the light-emitting region 4, may be a double heterostructure (DH) or, more commonly, a multiple quantum well (MQW) structure as is known in the art.

When current passes between top contact 9 and substrate contact 10 through active region 2, light is emitted from light-emitting region 4 in all directions—as illustrated by the dashed light-emission profile 7 of FIG. 2. Light-emission profile 7 corresponds to the current concentration in light-emitting region 4. Light emitted toward substrate 3 is absorbed by GaAs substrate 3. Light emitted away from substrate 3 and having an incident angle approaching normal or being normal to the top or bottom surfaces of window 6 is emitted from LED 1. Light having an oblique incident angle to window 6, however, may be reflected at the top surface of the window and subsequently absorbed by substrate 3.

In an effort to improve the light-extraction efficiency of AS-LED 1, a distributed Bragg reflector (DBR) 8 may be disposed between active region 2 and substrate 3. DBR 8 is only partially reflective, however, with on-resonance wavelengths and normal incidence angles providing the highest reflectivity. The light not reflected by DBR 8 will be absorbed by GaAs substrate 3.

FIGS. 3–7 illustrate another LED structure. Because this structure is formed with a transparent substrate 13, LED 11 is referred to as a TS-LED 11. An active region 12 is formed on a GaAs substrate 13a (similarly to AS-LED 1). Then, a GaP or AlGaAs window 16 is formed over active region 12, and GaAs substrate 13a is removed from the structure. Next, active region 12 and GaP or AlGaAs window 16 are wafer bonded to a transparent GaP substrate 13. Light emitted from active region 12 toward transparent GaP substrate 13 passes through transparent GaP substrate 13 without being absorbed and may escape from the GaP substrate 13 or be reflected by the device packaging (not shown).

Although TS-LED 11 provides better light extraction efficiency than AS-LED 1, there are several disadvantages associated with TS-LED 11. The semiconductor-to-semiconductor wafer bond between active region 12 and transparent GaP substrate 13 requires high precision and is extremely sensitive to contamination, thus the processing costs are high and the process yield is low. Another disadvantage of TS-LED 11 is that transparent GaP substrate 13 is expensive. In addition, the GaP/AlGaInP interface and the GaP substrate produce a higher forward voltage as compared to AS-LED 1. The higher forward voltage reduces the efficiency of the TS-LED 11.

Therefore, a need exists for an LED which provides high light extraction efficiency without the disadvantageous expense, low yield, and forward voltage of a TS-LED.

SUMMARY OF THE INVENTION

To meet this and other needs, and in view of its purposes, an exemplary embodiment of the present invention provides a high extraction efficiency light-emitting diode having a reflective submount. A light-emitting region is disposed between a top contact and a conductive holder and extends beyond an area underlying the top contact. An omni-directional reflector is disposed between the active region and the conductive holder. According to one embodiment, the reflector comprises one or more electrically conductive contacts configured to correspond to an area beyond the area underlying the top contact. According to one embodiment, the reflector comprises a dielectric layer having a refractive index of between about 1.10 and 2.25, contacts extending through the dielectric layer, and a reflective conductive film composed of a metal.

It is to be understood that both the foregoing general description and the following detailed description are exemplary, but are not restrictive, of the invention. The invention will be described in the context of the AlGaInP material system. However, it is noted that the invention can also be reduced to practice in LEDs composed of other materials, in particular in LEDs with light-emitting regions composed of GaAs, AlGaAs, GaN, GaInN, AlGaN, and AlGaInN.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 3–7 show sequential steps of a manufacturing process for an existing TS-LED;

FIGS. 11–17 show sequential steps of a manufacturing process for a reflecting submount LED according to an exemplary embodiment of the present invention;

FIGS. 20–24 show sequential steps of a manufacturing process for a reflecting submount LED according to an alternative exemplary embodiment of the present invention.

DETAILED DESCRIPTION OF THE INVENTION

Figure 1:
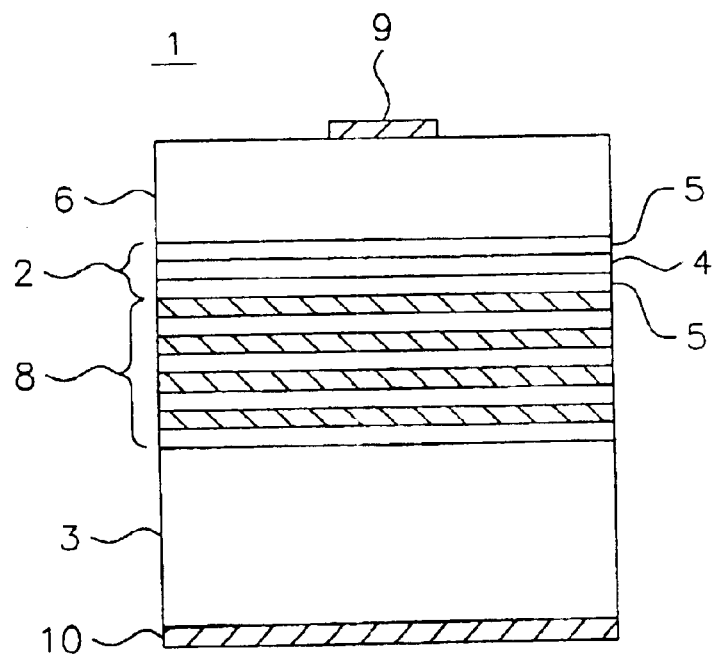
FIG. 1 is a sectional view of an existing AS-LED.
Figure 2:
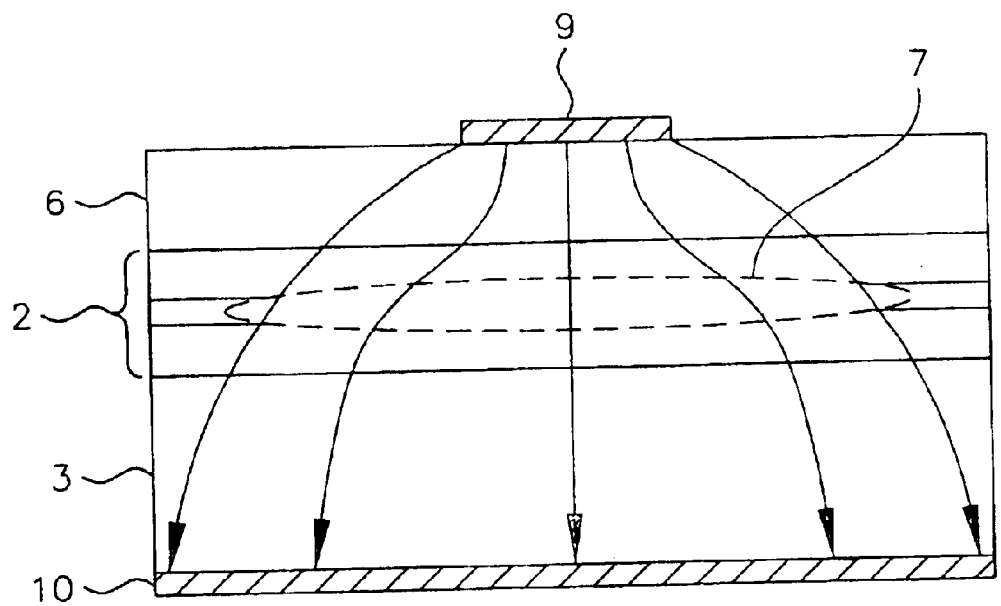
FIG. 2 shows the effect of a current spreading layer in an existing AS-LED.
Figure 8:
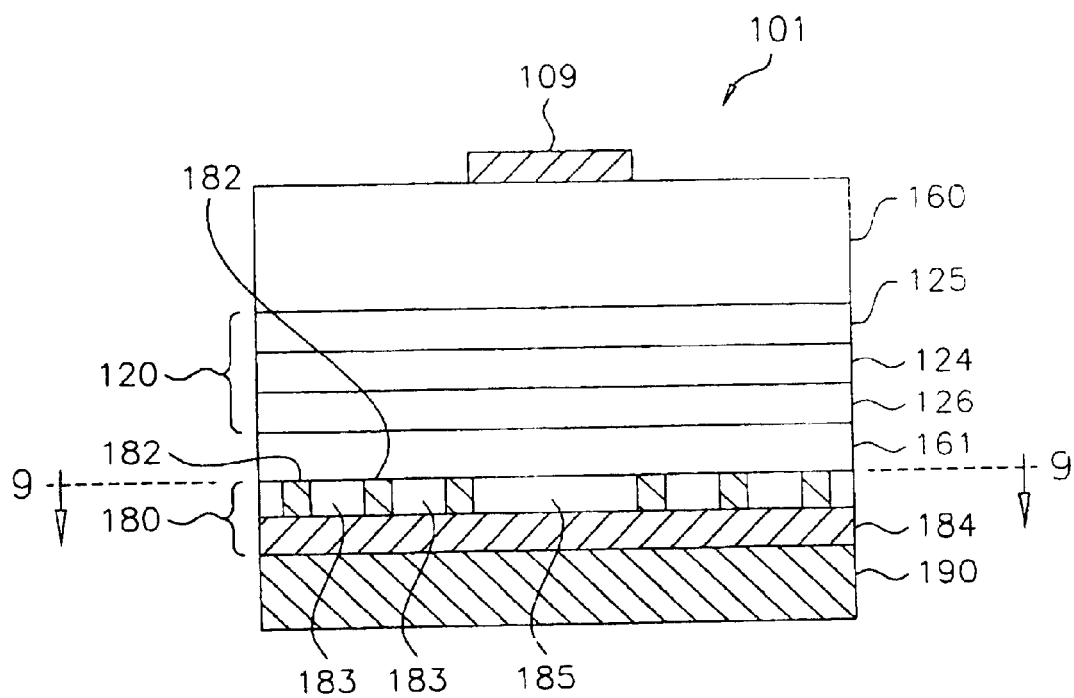
FIG. 8 is a sectional view of a reflecting submount LED according to an exemplary embodiment of the present invention.
Figure 9:
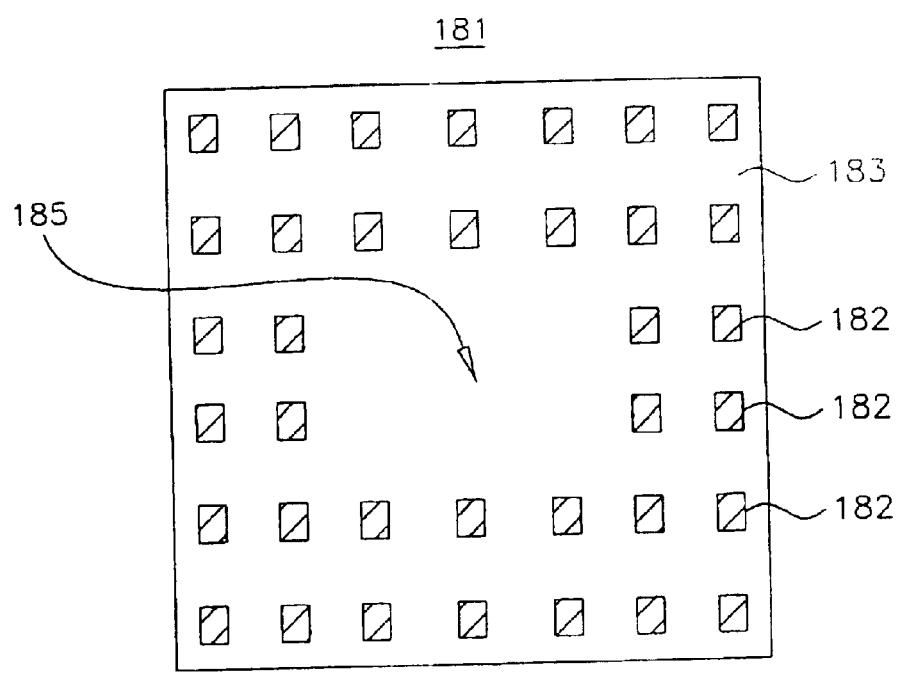
FIG. 9 is a cross-sectional view of the reflecting submount LED of FIG. 8 taken generally along the line 9—9 in FIG. 8.

Referring now to the drawing, in which like reference numbers refer to like elements throughout, FIGS. 8 and 9 show a reflecting submount light-emitting diode (RS-LED) 101 according to an exemplary embodiment of the present invention. Exemplary RS-LED 101 provides advantageous light output by reflecting light emitted downwardly (away from its top window). RS-LED 101 shown in FIGS. 8 and 9 also advantageously distributes current such that the light-emission profile is shifted from below the optically opaque top contact, allowing more of the emitted light to exit the device.

As used in this document, the terms top, over, upwardly, and the like indicate a direction toward the top of the corresponding figure which also corresponds to the direction from which light is emitted from the completed device. The term transparent means that light (in the relevant frequency range) passes through the composition or structure with little or no absorption.

Exemplary RS-LED 101 of FIG. 8 comprises, from top to bottom, a top contact 109, a top window 160, an active region 120, a bottom window 161, a reflector 180, and a conductive holder 190. Active region 120 comprises an emitting region 124 sandwiched between a bottom confinement layer 126 and a top confinement layer 125. The device illustrated in FIG. 8 and described below is preferably grown in a P-up configuration: the semiconducting structures gown after the light-emitting region 124 are P-type and the semiconducting structures grown before the light-emitting region 124 are N-type. It should be noted, however, that embodiments with an N-up configuration are also contemplated within the scope of the invention. Even though a p-type up growth is generally preferred, n-type-up growth is possible.

Top confinement layer 125 may comprise, for example, AlGaInP doped with a P-type dopant such as Mg or Zn ions at a concentration of between about 5.0EE16 and 1.0EE18 atm/cm$^3$. Bottom confinement layer 126 may comprise, for example, AlGaInP doped with an N-type dopant such as Si or Te ions at a concentration of between about 5.0EE16 and 1.0EE18 atm/cm$^3$. Emitting region 124 may comprise, for example, a semiconducting layer of uniform composition, a double heterostructure (DH), or, more commonly, a multiple quantum well (MQW) structure comprising AlGaInP.

Figure 10:
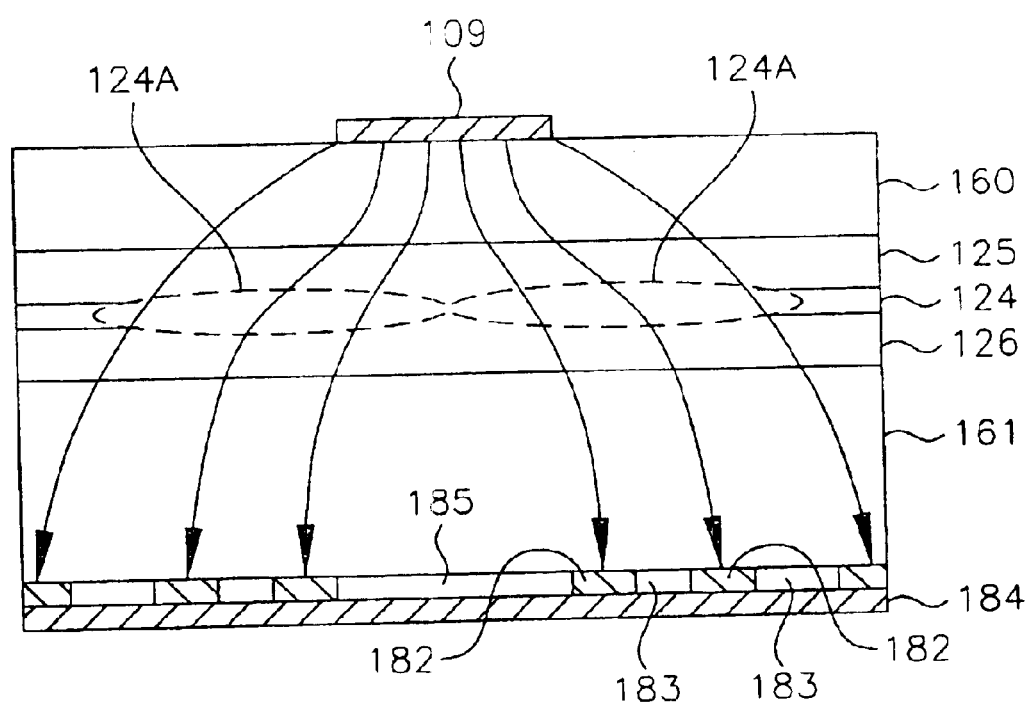
FIG. 10 shows the effect of a current-spreading layer in a reflecting submount LED according to an exemplary embodiment of the present invention.

Top and bottom windows 160, 161 each comprise a transparent, electrically conductive material, such as GaP, AlGaInP, AlInP, AlGaAs or GaInP with a low In content. Top window 160 may comprise, for example, AlGaInP doped with a P-type dopant such as Mg or Zn ions at a concentration of between about 1.0EE17 and 1.0EE19 atm/cm$^3$. Bottom window 161 may also comprise AlGaInP doped with an N-type dopant such as Si or Te ions at a concentration of between about 1.0EE17 and 1.0EE19 atm/cm$^3$. Windows 160, 161 are generally transparent, absorbing only a minor fraction of the light transmitted through them. It should be noted that GaP should only be used for the top or bottom window 160, 161 grown after active region 120, because the GaP lattice would cause a mismatch with an AlGaInP lattice that is lattice-matched to the GaAs substrate. Top window 160 has a thickness of between about 1 and 25 microns, preferably between about 5 and 20 microns. Bottom window 161 has a thickness of between about 1 and 25 microns, preferably between about 1 and 15 microns. Top window 160 spreads current beyond the boundary of top contact 109, as shown in FIG. 10. Bottom window 161 spreads current between ohmic contacts 182.

Reflector 180 comprises a transparent layer 183, an array of ohmic contacts 182, and a reflective film 184. Transparent layer 183 has a low index of refraction, preferably between about 1.10 and 2.25. In the exemplary embodiment illustrated in FIGS. 8 and 9, transparent layer 183 comprises a low refractive index insulating material, such as silicon dioxide ($SiO_2$), silicon nitride ($Si_3N_4$), or Magnesium fluoride (MgF). The thickness (th) of transparent layer 183 is approximated by the equation:

$$th = \lambda/(4n) \qquad \text{(eq. 1)}$$

where $\lambda$ is the peak emission wavelength of the LED and n is the refractive index of transparent layer 183. This thickness helps to ensure that light, which strikes transparent layer 183 over a wide range of incident angles, is reflected with high reflectivity.

Extending through transparent layer 183 is an array of ohmic contacts 182 configured in a pattern 181. Ohmic contacts 182 define a central portion 185, in transparent layer 183, positioned to correspond to top contact 109. Ohmic contacts 182 provide a low resistance electrical contact with the overlying semiconductor layers and may comprise, for example, a metal composition, such as AuGe—Ni—Au for N-type ohmic contacts and AuZn or AuBe for P-type contacts. As shown in FIG. 9, ohmic contacts 182 comprise a small fraction of the interface area between reflective film 184 and bottom window 161. Ohmic contacts 182 comprise between about 0.25 and 10 percent of the interface area. This small ohmic contact surface area increases the portion of light that reaches and is reflected by the underlying reflective film 184. Increased reflection, in turn, increases the light extraction efficiency of the LED.

Pattern 181 enhances the current-spreading function of top window 160. As shown in FIG. 10, electrical current is prevented from passing through insulating transparent layer 183, including central portion 185 of insulating transparent layer 183, and is instead drawn toward contacts 182. Note that contacts 182 do not underlie top conductor 109. Thus, the current distribution (represented by the width of the dashed light-emission profile 124A) in emitting region 124 is greater in the portions of emitting region 124 beyond top conductor 109 than in the portion of emitting region 124 underlying top conductor 109. Consequently, a smaller portion of the emitted light is reflected, scattered, or absorbed by opaque top contact 109.

Reflective film 184 comprises an electrically conductive material that has a high reflectivity, serving as both an electrical contact and a reflector. Suitable materials for reflective film 184 include silver (Ag) and aluminum (Al). The thickness and low refractive index of transparent layer 183 coupled with the high reflectivity of reflective film 184 cause nearly all of the light emitted downwardly to be reflected rather than absorbed, enhancing extraction efficiency.

Conductive holder 190 shown in FIG. 8 is attached to reflective film 184, providing structural stability and electrical contact. Conductive holder 190 may be, for example, a conductive metal structure or a silicon wafer with a metal coating on its top and bottom faces. Active region 120 and windows 160, 161 of RS-LED 101 are thin, less than 50 microns thick and, as a result, are mechanically fragile. Conductive holder 190 has a sufficient thickness to provide structural stability. In an exemplary embodiment, the interface of reflective film 184 and conductive holder 190 is metal-to-metal. Therefore, conductive holder 190 can be mechanically and electrically connected to reflective film 184 using a high-yield process, such as soldering or gluing using a conductive adhesive, thus avoiding the semiconductor-to-semiconductor wafer-bonding problems of TS-LED 11.

Referring to FIGS. 11–17, an exemplary method is provided for forming a RS-LED 101. Bottom window 161, active region 120, and top window 160 (collectively comprising semiconducting or epitaxial layers) are sequentially formed on a GaAs substrate 201. The epitaxial layers may be formed, for example, using a Metal-Organic Vapor Phase Epitaxial (MOVPE) process with an AlGaInP chemistry. Bottom window 161 is preferably deposited or grown to a thickness of about 1 to 15 micron. Bottom confinement layer 126 is deposited or grown over bottom window 161. Bottom confinement layer 126 may be deposited or grown, for example, by continued MOVPE. Window layers and confinement layers are doped to ensure electrical conductivity of the layers and the formation of a PN junction.

An AlGaInP light-emitting region 124 is formed over bottom confinement layer 126. Emitting region 124 may comprise, for example, a DH or MQW structure as are known in the art. Next a top confinement layer 125 and a top window 160 are sequentially deposited or grown over emitting region 124. Both top confinement layer 125 and top window 160 are doped with a P-type dopant such as Mg or Zn ions, with top window 160 having a greater dopant concentration than top confinement layer 125. Alternatively, an AlInP, or AlGaAs chemistry may be used in place of the AlGaInP chemistry for windows 160, 161. Also, a GaP chemistry may be used for top window 160 formed after active region 120 in the present method.

After the epitaxial layers are deposited or grown using a MOVPE process, top contact 109 is formed over top window 160. Top contact 109 may comprise, for example, a conductive metal such as a AuZn or AuBe alloy covered by aluminum or gold formed by a deposition and patterning process. Such alloys form a contact to P-type semiconductors. Then, a temporary holder 203 is attached to top contact 109 and top window 160 by wax or other removable substance, and substrate 201 is removed from the epitaxial layers. The bulk of substrate 201 may be removed by a chemical-mechanical polishing process, with about the final 20 microns being removed by selective wet chemical etch.

Back-side processing, shown in FIG. 15, is performed after removal of substrate 201. Pattern 181 of ohmic contacts 182 is formed, extending through transparent layer 183 with a low index of refraction. Transparent layer 183 may be formed by deposition on bottom window 161 with the epitaxial layers inverted (i.e., with temporary holder 203 down, opposite from the position shown in FIG. 15), then patterned to form openings for ohmic contacts 182 using a photolithography process. Ohmic contacts 182 may then be formed by another photolithographic process. As described above, ohmic contacts 182 may comprise a metalization such as AuGe—Ni—Au. Such alloys form a contact to N-type semiconductors.

Alternatively, pattern 181 may be formed by blanket deposition of a metal layer and patterning the blanket metal layer. Transparent layer 183 may then be formed over pattern 181 and planarized to expose ohmic contacts 182. Alternatively, transparent layer 183 may be blanket deposited and patterned to form contact vias. Reflective film 184 is then formed over transparent layer 183 and ohmic contacts 182, providing electrical continuity between reflective film 184 and the epitaxial layers through ohmic contacts 182.

Conductive holder 190 is attached to reflective film 184 by conductive adhesive, soldering, or another process providing mechanical attachment and electrical connection. It should be noted that attachment of conductive holder 190 to reflective film 184 does not require the precision wafer-to-wafer bonding associated with TS-LED 11. After conductive holder 190 is attached, temporary holder 203 is removed.

Figure 18:
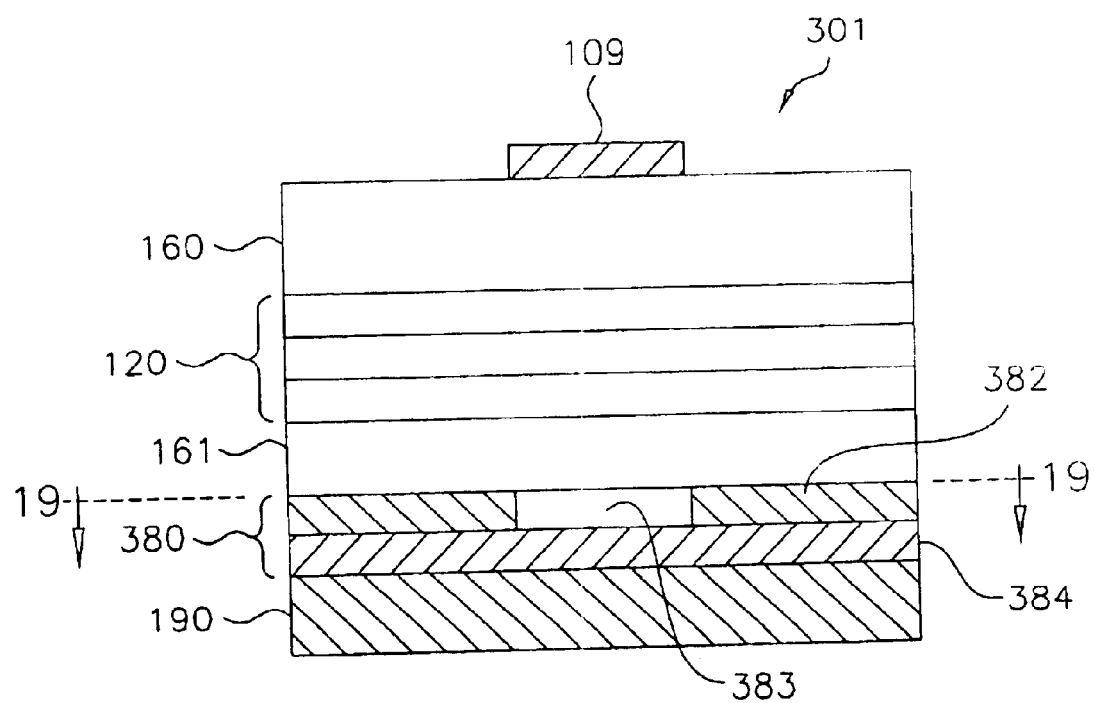
FIG. 18 is a sectional view of a reflective submount LED according to an alternative exemplary embodiment of the present invention.
Figure 19:
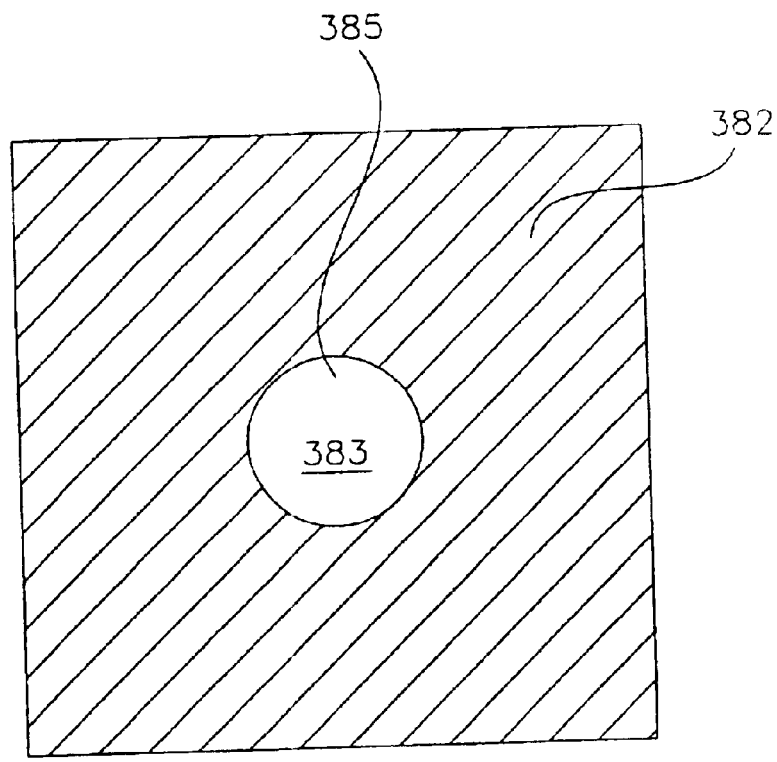
FIG. 19 is a cross-sectional view of the reflective submount LED of FIG. 18 taken generally along the line 19—19.

An alternative exemplary RS-LED 301 is shown in FIGS. 18 and 19. Epitaxial layers 160, 120, 161 and top contact 109 are similar to the exemplary embodiment described above and illustrated in FIGS. 8–17. Alternative RS-LED 301 comprises a reflector 380 subjacent bottom window 161. Reflector 380 comprises a refractive layer having a conductive low refractive index region 382 and an insulting low refractive index region 383. Conductive low refractive index region 382 is configured with a central portion 385 positioned to correspond to top conductor 109. Conductive low refractive index region 382 may comprise an electrically conductive material such as InSnO, frequently referred to as ITO, having an index of refraction between about 1.10 and 2.25. Insulating low refractive index region 383 may comprise an electrically insulating material, such as $SiO_2$ or $Si_3N_4$, having an index of refraction between about 1.10 and 2.25. Insulating low refractive index region 383 is formed at least in central portion 385. As with the embodiment described above, the thickness (th) of the refractive layer is approximated by Equation 1 (th=λ/4n).

An alternative exemplary method for forming the RS-LED is illustrated in FIGS. 20–24. Epitaxial layers 160, 120, 161 are grown or deposited on a GaAs substrate 201 as described above. Following formation of the epitaxial layers, backside processing is performed as shown in FIG. 21. Insulating low refractive index layer 183 is formed and patterned, followed by deposition of ohmic contacts 182 in insulating low refractive index layer 183. Alternatively, an ohmic contact layer may be blanket deposited and patterned to form ohmic contacts 182, with insulating low refractive index layer 183 deposited between ohmic contacts 182. Planarization steps may be performed as required. Reflective metallic film 184 is then formed over ohmic contacts 182 and insulating low refractive index layer 183. The materials and thickness of ohmic contacts 182, insulating low refractive index layer 183, and reflective film 184 are similar to the embodiment described above.

Conductive holder 190 is attached to reflective film 184, as shown in FIG. 22. Then, substrate 201 is removed, as shown in FIG. 23, and top contact 109 is formed over top window 160 as shown in FIG. 24. This alternative exemplary method allows bottom window 161 to be formed after active region 120, so that bottom window 161 may be GaP or other materials that are lattice-mismatched with respect to GaAs.

It is generally known that surface texturing (also called surface roughening) of an LED can increase the light extraction efficiency of an LED. Surface texturing of the top surface of the LED has proven to be particularly effective. Surface texturing may include random roughening, the fabrication of grating structures, and the fabrication of photonic bandgap structures. Surface-textured structures would be well known to a person skilled in the art. Such surface texturing may also be applied in the present invention to increase light-extraction from the LED. For example, the top surface of layer 160 in FIG. 8, FIG. 10, or FIG. 18 may be surface textured.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A light-emitting diode comprising:
  a top contact
  a conductive holder;
  a light-emitting region disposed between the top contact and the conductive holder including an area underlying the top contact and another area extending beyond the area underlying the top contact; and
  an omni-directional reflector disposed between the light-emitting region and the conductive holder, the omni-directional reflector having a plurality electrically conductive contacts configured to correspond to a region beyond the area underlying the top contact, wherein the plurality of electrically conductive contacts are disposed in a dielectric layer, the dielectric layer having a reflective index of between about 1.10 and 2.25.

2. The light-emitting diode of claim 1 wherein the dielectric layer comprises silicon dioxide.

3. The light-emitting diode of claim 1 wherein the dielectric layer comprises silicon nitride.

4. The light-emitting diode of claim 1 wherein the dielectric layer comprises magnesium fluoride.

5. The light-emitting diode of claim 1 wherein the dielectric layer has a thickness proportional to approximately a quarter-wavelength of the extracted light and inversely proportional to its refractive index.

6. The light-emitting diode of claim 1 wherein the plurality of electrically conductive contacts is a pattern of ohmic contacts covering less than half of the cross-sectional area of the dielectric layer.

7. The light-emitting diode of claim 6 wherein the pattern of ohmic contacts covers less than one-tenth of the cross-sectional area of the dielectric layer.

8. The light-emitting diode of claim 1 wherein the omni-directional reflector comprises an insulating layer having a refractive index of between about 1.10 and 2.25 underlying the top contact and a single conductive contact having a refractive index of between about 1.10 and 2.25 underlying an area beyond the periphery of the top contact.

9. The light-emitting diode of claim 8 wherein the insulating layer comprises silicon dioxide.

10. The light-emitting diode of claim 8 wherein the conductive contact comprises indium-tin-oxide.

11. The light-emitting diode of claim 1, wherein the plurality of electrically conductive contacts are electrically conductive metal contacts.

12. A light-emitting diode comprising:
  an active region having two opposite conductivity-type confinement layers with a light-emitting region disposed between the layers;
  an omni-directional reflector proximate a first one at the confinement layers opposite the light-emitting region; and
  first and second windows, the first window being disposed adjacent the confinement layer and the second window being opposite the light-emitting region.

13. The light-emitting diode of claim 12 wherein the light-emitting region comprises a multiple quantum well structure, the confinement layers comprise AlGaInP doped with a p-type dopant and AlGaInP doped with a n-type dopant, and at least one of the windows comprise doped AlGaInP.

14. The light-emitting diode of claim 13 wherein one of the windows comprises essentially GaP.

15. The light-emitting diode of claim 14 wherein the first window comprises GaP.

16. The light-emitting diode of claim 14 wherein the second window comprises GaP.

17. The light-emitting diode of claim 13 wherein the first and second windows have a thickness of between about 1 and 25 microns.

18. The light-emitting diode of claim 13 wherein the first window has a thickness of between about 5 and 20 microns and the second window has a thickness of between about 1 and 15 microns.

19. The light-emitting diode of claim 12, wherein the omni-directional reflector includes one or more electrically conductive metal contacts.

20. A light-emitting diode comprising:
  an active region having two opposite conductivity-type, confinement layers with a light-emitting region disposed between the layers; and
  an omni-directional reflector proximate a first one or the confinement layers opposite the light-emitting region, wherein the omni-directional reflector comprises a dielectric layer having a low refractive index, an array of ohmic contacts extending through the dielectric layer, and a metal layer disposed proximate the dielectric layer opposite the light-emitting region.

21. The light-emitting diode of claim 20 wherein the array of ohmic contacts is disposed in a pattern underlying an area beyond the periphery of the top contact.

* * * * *

UNITED STATES PATENT AND TRADEMARK OFFICE
CERTIFICATE OF CORRECTION

PATENT NO. : 6,784,462 B2 Page 1 of 1
APPLICATION NO. : 10/317564
DATED : August 31, 2004
INVENTOR(S) : E. Fred Schubert It is certified that error appears in the above-identified patent and that said Letters Patent is hereby corrected as shown below:

At Column 3, line 54, "gown" should be --grown--;
At Column 4, line 32, "(Si3N4)." should be --(Si3N4)--;

At Column 7, line 38, insert --of-- after "plurality";
At Column 7, line 43, "reflective" should be --refractive--;

At Column 8, line 4, "an" should be --the--;
At Column 8, line 17 "at" should be --of--;
At Column 8, line 47 delete the comma after "conductivity-type";
At Column 8, line 51 "or" should be --of--.

Signed and Sealed this

Ninth Day of January, 2007

JON W. DUDAS
*Director of the United States Patent and Trademark Office*

UNITED STATES PATENT AND TRADEMARK OFFICE
CERTIFICATE OF CORRECTION

PATENT NO.         : 6,784,462 B2                                    Page 1 of 1
APPLICATION NO.    : 10/317564
DATED              : August 31, 2004
INVENTOR(S)        : E. Fred Schubert It is certified that error appears in the above-identified patent and that said Letters Patent is hereby corrected as shown below:

At column 7, line 30, insert --;-- after "a top contact"

Signed and Sealed this

Twenty-second Day of June, 2010

David J. Kappos
*Director of the United States Patent and Trademark Office*